United States Patent
Choi

(10) Patent No.: US 8,222,638 B2
(45) Date of Patent: Jul. 17, 2012

(54) ARRAY SUBSTRATE FOR ORGANIC ELECTROLUMINESCENT DEVICE

(75) Inventor: Hee-Dong Choi, Seosan-si (KR)

(73) Assignee: LG Display Co., Ltd., Seoul (KR)

( * ) Notice: Subject to any disclaimer, the term of this patent is extended or adjusted under 35 U.S.C. 154(b) by 173 days.

(21) Appl. No.: 12/890,112

(22) Filed: Sep. 24, 2010

(65) Prior Publication Data

US 2011/0079783 A1 Apr. 7, 2011

(30) Foreign Application Priority Data

Oct. 1, 2009 (KR) .................. 10-2009-0094008

(51) Int. Cl.
*H01L 51/50* (2006.01)

(52) U.S. Cl. .......... 257/40; 257/E51.001; 257/E51.022; 438/29; 438/99

(58) Field of Classification Search ............. 257/40, 257/E51.001, E51.022; 438/29, 99
See application file for complete search history.

(56) References Cited

U.S. PATENT DOCUMENTS

| 6,867,541 | B2* | 3/2005 | Okuyama et al. | 313/506 |
| 8,129,712 | B2* | 3/2012 | Nishikawa et al. | 257/40 |
| 8,158,989 | B2* | 4/2012 | Jung et al. | 257/83 |
| 2003/0180979 | A1* | 9/2003 | Katayama | 438/30 |
| 2005/0140277 | A1* | 6/2005 | Suzuki et al. | 313/504 |
| 2005/0140288 | A1* | 6/2005 | Suzuki | 313/506 |
| 2007/0015429 | A1* | 1/2007 | Maeda et al. | 445/24 |
| 2008/0309232 | A1* | 12/2008 | Yamamoto | 313/505 |
| 2009/0286386 | A1* | 11/2009 | Lee et al. | 438/586 |
| 2010/0060148 | A1* | 3/2010 | Hwang et al. | 313/504 |
| 2011/0143470 | A1* | 6/2011 | Lee | 438/34 |

* cited by examiner

*Primary Examiner* — Hsien Ming Lee
*Assistant Examiner* — Michele Fan
(74) *Attorney, Agent, or Firm* — McKenna Long & Aldridge, LLP

(57) ABSTRACT

An array substrate for an organic electroluminescent device includes a substrate; first and second gate electrodes; first and second gate insulating layers; first and second active layers; an interlayer insulating layer; first to fourth ohmic contact layers; first and second source electrodes; first and second drain electrodes; a data line connected to the first source electrode; a first power line connected to the second source electrode; a first passivation layer on the first and second source electrodes; a gate line contacting the first gate electrode; a second passivation layer on the gate line; a pixel electrode on the second passivation layer and contacting the second drain electrode; an organic luminescent layer on the pixel electrode; and a reference electrode on the organic luminescent layer, wherein portions of the pixel electrodes respectively contacting the organic luminescent layers in one pixel region and in another one pixel region have different heights from the substrate.

20 Claims, 5 Drawing Sheets dry-etching

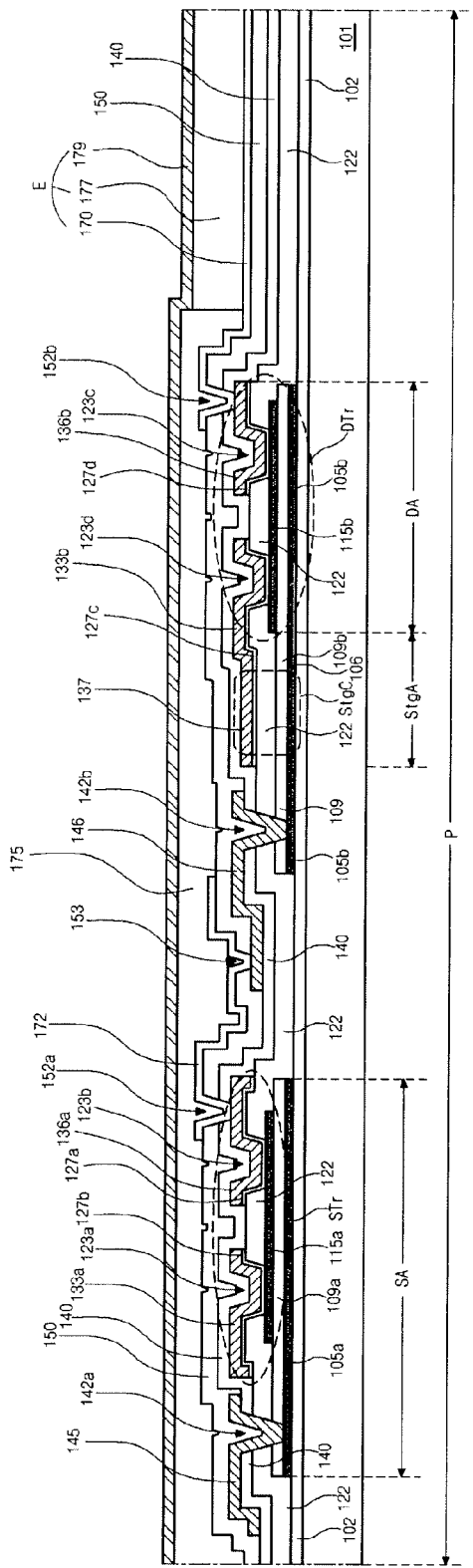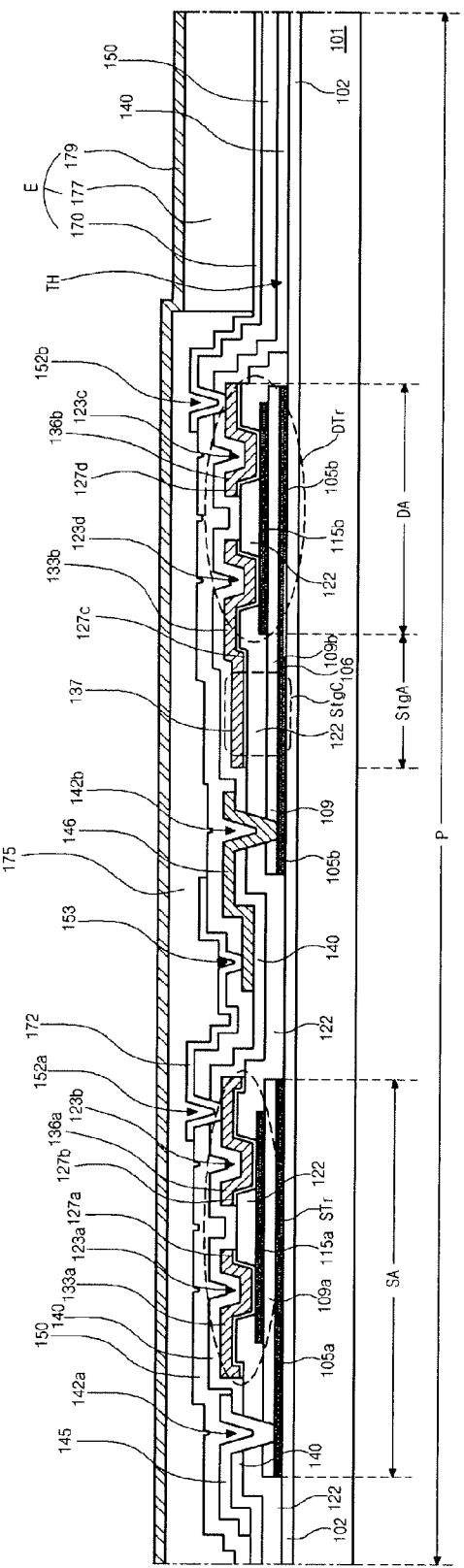

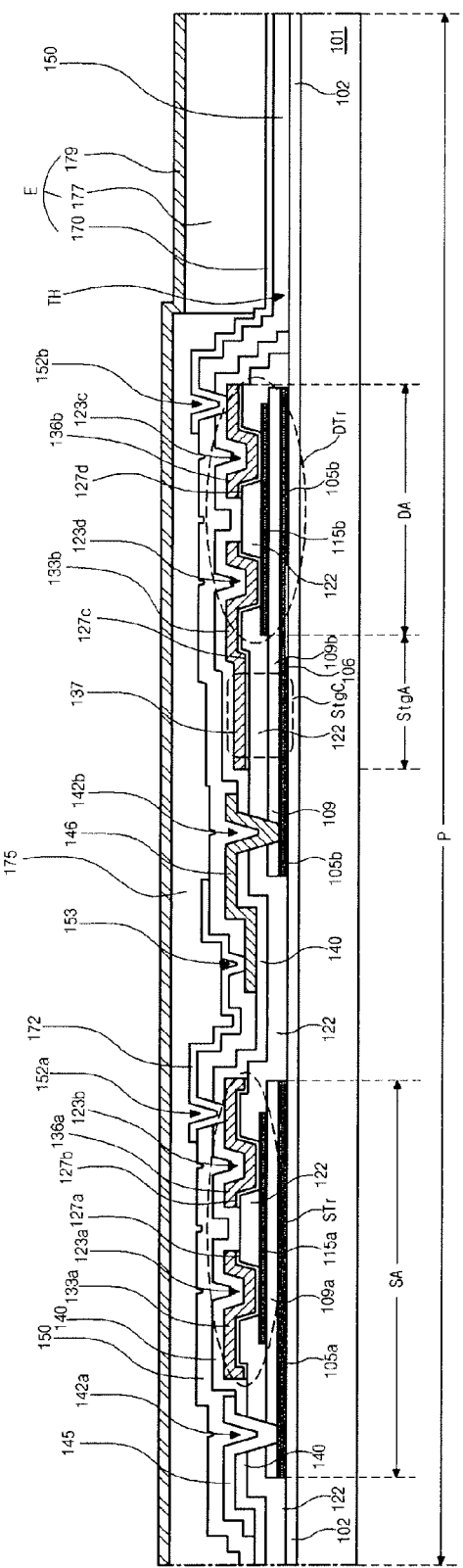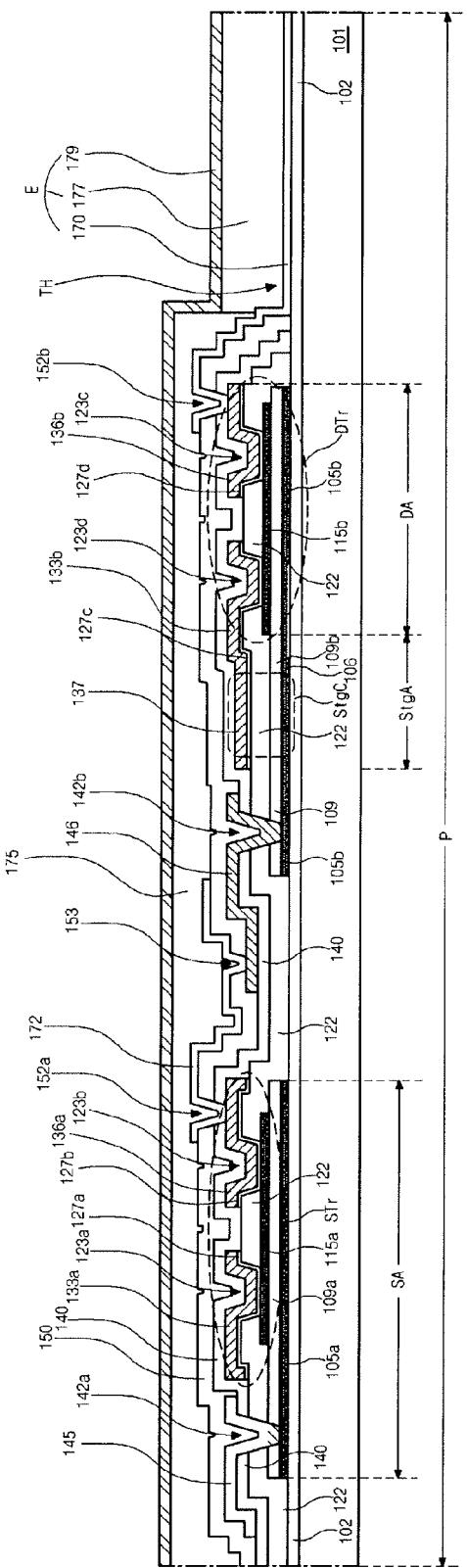

ARRAY SUBSTRATE FOR ORGANIC ELECTROLUMINESCENT DEVICE

The present application claims the benefit of Korean Patent Application No. 10-2009-0094008, filed in Korea on Oct. 1, 2009, which is hereby incorporated by reference for all purposes as if fully set forth herein.

BACKGROUND OF THE INVENTION

1. Field of the Invention

The present invention relates to an array substrate for an organic electroluminescent device (OELD), and more particularly, to an array substrate for an OELD that includes a thin film transistor having excellent properties and has high emitting efficiency.

2. Discussion of the Related Art

As the society has entered in earnest upon an information age, a field of display devices that represent all sorts of electrical signals as visual images has developed rapidly. Particularly, the liquid crystal display (LCD) device or the OELD device as a flat panel display device having characteristics of light weight, thinness and low power consumption is developed to be used as a substitute for a display device of cathode-ray tube type.

Since the LCD device including a thin film transistor (TFT) as a switching element, referred to as an active matrix LCD (AM-LCD) device, has excellent characteristics of high resolution and displaying moving images, the AM-LCD device has been widely used.

On the other hand, since the OELD device has excellent characteristics of high brightness, a low power consumption and high contrast ratio, the OELD device has been widely used. Moreover, the OELD device has advantages of a high response rate, a low production cost and so on.

Both the LCD device and the OELD device require an array substrate including a thin film transistor (TFT) as a switching element for controlling on and off of each pixel region. In addition, the OELD device requires another TFT as a driving element for driving an organic electroluminescent diode in each pixel region.

FIG. 1 is a cross-sectional view of a portion of the related art array substrate for the OELD device. For convenience of explanation, a region, where a driving TFT is formed, is defined as a driving region TrA.

In FIG. 1, the array substrate includes a substrate 11 including a pixel region P and the driving region TrA. On the substrate 11, a gate line (not shown) and a data line 33 are disposed to define the pixel region P. The gate line and the data line 33 cross each other to define the pixel region. In the driving region TrA in the pixel region P, a gate electrode 15 is disposed, and a gate insulating layer 18 covers the gate electrode 15. A semiconductor layer 28 including an active layer 22 and an ohmic contact hole 26 is disposed on the gate insulating layer 18 and in the driving region TrA. The active layer 22 is formed of intrinsic amorphous silicon, and the ohmic contact layer 26 is formed of impurity-doped amorphous silicon. A source electrode 36 and a drain electrode 38, which is spaced apart from the source electrode 36, are formed on the semiconductor layer 28. A portion of the ohmic contact layer 28 corresponding to a space between the source and drain electrodes 36 and 38 is removed such that a center of the active layer 22 is exposed through the space between the source and drain electrodes 36 and 38.

The gate electrode 15, the gate insulating layer 18, the semiconductor layer 28, the source electrode 36 and the drain electrode 38 constitute the driving TFT Tr. Although not shown, a switching TFT having substantially the same structures as the driving TFT Tr is formed in the pixel region P. The switching TFT is connected to the gate line, the data line 33 and the driving TFT Tr.

A passivation layer 42 including a drain contact hole 45 is formed on the driving TFT Tr. The drain contact hole 45 exposes the drain electrode 38 of the driving TFT Tr. A pixel electrode 50 contacting the drain electrode 38 of the driving TFT Tr is formed on the passivation layer 42 and in each pixel region P. A semiconductor pattern 29 including a first pattern 27, which is formed of the same material and disposed on the same layer as the ohmic contact layer 26, and a second pattern 23, which is formed of the same material and disposed on the same layer as the active layer 22, is disposed under the data line 33.

The active layer 22 has a difference in a thickness. Namely, a center portion, which is exposed through the space between the source and drain electrodes 36 and 38, of the active layer 22 has a first thickness t1, and a side portion, on which the ohmic contact layer 26 is formed, of the active layer 22 has a second thickness t2 being different from the first thickness t1. (t1≠t2) The thickness difference in the active layer 22 is caused by a fabricating method. Properties of the TFT are degraded by the thickness difference in the active layer 22.

FIG. 2 is a cross-sectional view showing a process for forming the semiconductor layer, the source electrode and the drain electrode in the related art array substrate. For convenience of explanation, the gate electrode and the gate insulating layer are not shown.

In FIG. 2, an intrinsic amorphous silicon layer (not shown), an impurity-doped amorphous silicon layer (not shown), and a metal layer (not shown) are sequentially formed on the substrate 11. The metal layer, the impurity-doped amorphous silicon layer and the intrinsic amorphous silicon layer are patterned to form a metal pattern (not shown), an impurity-doped amorphous silicon pattern (not shown) under the metal pattern, and an intrinsic amorphous silicon pattern (not shown) under the impurity-doped amorphous silicon pattern.

Next, a center portion of the metal pattern is etched to form the source electrode 36 and the drain electrode 38 spaced from the source electrode 36. By etching the metal pattern, a center portion of the impurity-doped amorphous silicon pattern is exposed through the space between the source electrode 36 and the drain electrode 38.

Next, the exposed center portion of the impurity-doped amorphous silicon pattern is dry-etched to form the ohmic contact layer 26 under the source electrode 36 and the drain electrode 38. In this case, the dry-etching process for the exposed center portion of the impurity-doped amorphous silicon pattern is performed during a sufficient long time to completely remove the exposed center portion of the impurity-doped amorphous silicon pattern. By dry-etching the exposed center portion of the impurity-doped amorphous silicon pattern, a center portion of the active layer 22 of intrinsic amorphous silicon is partially etched. However, a side portion of the active layer 22 is not etched because the ohmic contact layer 26 blocks the side portion of the active layer 22. As a result, the active layer 22 has a thickness difference. (t1≠t2)

If the dry-etching process for the exposed center portion of the impurity-doped amorphous silicon pattern is not performed during a sufficient long time to avoid the thickness difference, the impurity-doped amorphous silicon may remain on the active layer 22 such that properties of the TFT is degraded. Accordingly, it is required to perform the dry-etching process for the exposed center portion of the impurity-doped amorphous silicon pattern during a sufficient long time.

Accordingly, in the above fabricating process for the related art array substrate, the thickness difference in the active layer is an inevitable result such that properties of the TFT are degraded.

In addition, since the intrinsic amorphous silicon layer for the active layer should be formed with a sufficient thickness, for example, more than about 1000 Å, considering etched thickness, production yield is reduced and production cost is increased.

Generally, the active layer for the TFT is formed of intrinsic amorphous silicon. Since atoms of intrinsic amorphous silicon are randomly arranged, it has a metastable station with light or an electric field such that there is a problem in stability as a TFT. In addition, since a carrier mobility in a channel is relatively low, i.e., 0.1 $cm^2/V \cdot S \sim 1.01\ cm^2/V \cdot S$, there is a limitation in use of a driving element.

To resolve these problems, a fabricating method of a thin film transistor, which includes an active layer of polycrystalline silicon by crystallizing amorphous silicon into polycrystalline silicon through a crystallizing process with a laser beam apparatus, is introduced.

However, referring to FIG. 3, which shows a cross-sectional view of the related art array substrate including the active layer of polycrystalline silicon, a doping process is required. Namely, in the array substrate 51 including the TFT Tr, high concentration impurities should be doped into both sides of the center region 55a of the semiconductor layer 55 of polycrystalline silicon to form n+ region 55b. The region 55b may be p+ region depending on a kind of the impurities. Accordingly, an implantation apparatus for the doping process is required, so new process line is required and production costs are increased.

SUMMARY OF THE INVENTION

Accordingly, the present invention is directed to an array substrate for an OELD that substantially obviates one or more of the problems due to limitations and disadvantages of the related art.

An object of the present invention is to provide an array substrate for an OELD including a thin film transistor having improved properties.

Another object of the present invention is to provide an array substrate for an OELD having high emitting efficiency.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an array substrate for an organic electroluminescent device includes a substrate including a pixel region; first and second gate electrodes on the substrate; first and second gate insulating layers on the first and second gate electrodes, respectively; first and second active layers on the first and second gate insulating layers, respectively; an interlayer insulating layer on the first and second active layers and including first to fourth active contact holes, the first and second active contact holes respectively exposing both sides of the first active layer, the third and fourth active contact holes respectively exposing both sides of the second active layer; first and second ohmic contact layers respectively contacting the both sides of the first active layer through the first and second active contact holes; third and fourth ohmic contact layers respectively contacting the both sides of the second active layer through the third and fourth active contact holes; first and second source electrodes on the first and third ohmic contact layers, respectively; first and second drain electrodes on the second and fourth ohmic contact layers, respectively, the first drain electrode electrically connected to the second gate electrode; a data line on the interlayer insulating layer and connected to the first source electrode; a first power line parallel to the data line and connected to the second source electrode; a first passivation layer on the first and second source electrodes, the first and second drain electrodes and the data line and including a first gate contact hole exposing the first gate electrode; a gate line on the first passivation layer and contacting the first gate electrode through the first gate contact hole, the gate line crossing the data line to define the pixel region; a second passivation layer on the gate line, the second passivation layer and the first passivation layer including a first drain contact hole exposing the second drain electrode; a pixel electrode in the pixel region and on the second passivation layer, the pixel electrode contacting the second drain electrode through the first drain contact hole; an organic luminescent layer on the pixel electrode and in the pixel region; and a reference electrode on the organic luminescent layer and covering an entire of the substrate, wherein portions of the pixel electrodes respectively contacting the organic luminescent layers in one pixel region and in another one pixel region have different heights from the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIGS. 5A to 5D are cross-sectional views showing pixel regions, each of which emits different colors, respectively, taken along the line V-V of FIG. 4.

DETAILED DESCRIPTION OF THE EMBODIMENTS

Reference will now be made in detail to the preferred embodiments, examples of which are illustrated in the accompanying drawings.

Figure 1:
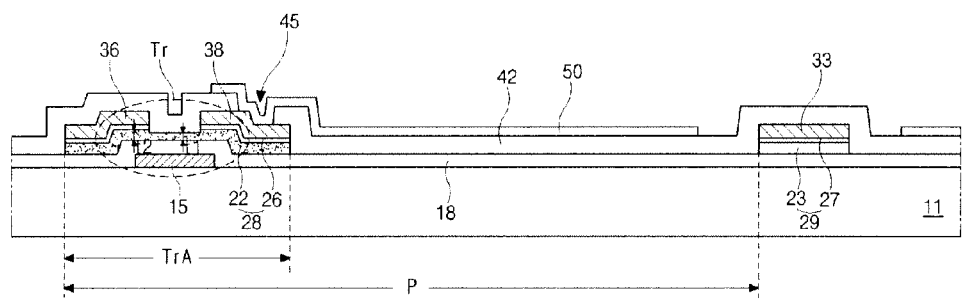
FIG. 1 is a cross-sectional view of a portion of the related art array substrate for the OELD device.
Figure 2:
FIG. 2 is a cross-sectional view showing a process for forming the semiconductor layer, the source electrode and the drain electrode in the related art array substrate.
Figure 2:
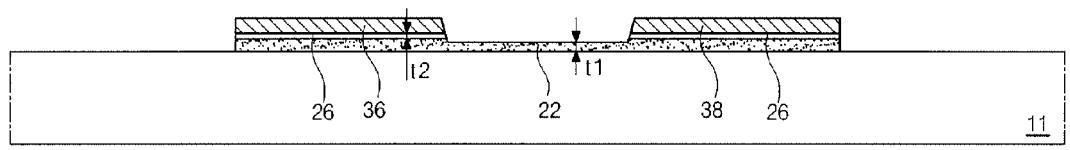
Figure 3:
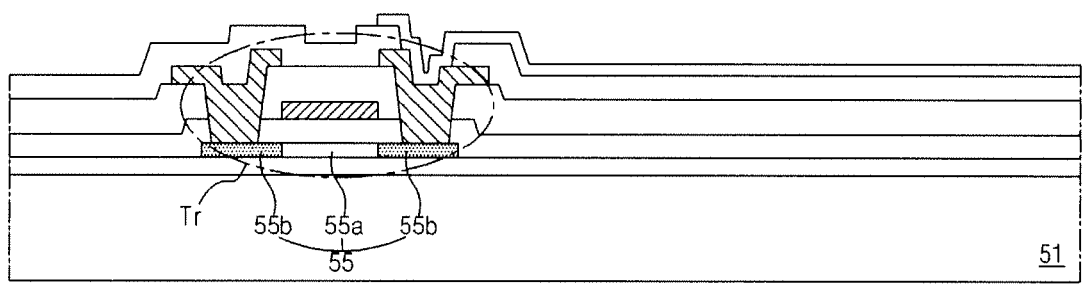
FIG. 3 is a cross-sectional view of the related art array substrate including the active layer of polycrystalline silicon.
Figure 4:
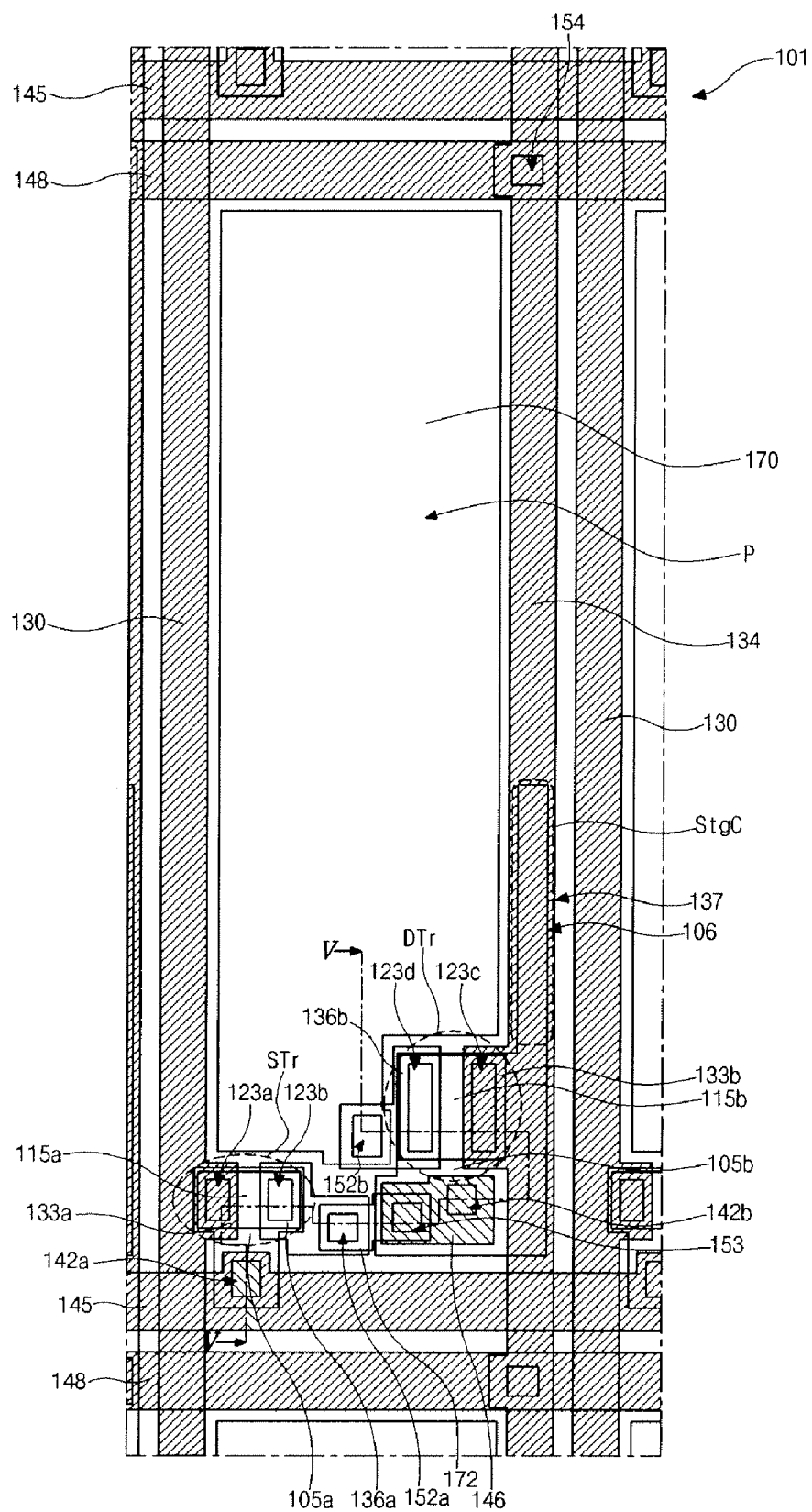
FIG. 4 is a plane view showing one pixel region of an array substrate for an OELD device according to the present invention.

FIG. 4 is a plane view showing one pixel region of an array substrate for an OELD device according to the present invention.

In FIG. 4, on a substrate 101 of the array substrate, gate and data lines 145 and 130, which cross each other to define a pixel region P, are disposed. A first power line 134, which is parallel to the data line 130, is disposed over the substrate 101. In addition, a second power line 148, which is connected to the first power line 134 through the power contact hole 154, is parallel to and spaced apart from the gate line 145.

In the pixel region P, a switching TFT STr and a driving TFT DTr are disposed. The switching TFT STr includes a first gate electrode 105a, a first active layer (not shown), first and second ohmic contact layers (not shown), a first source electrode 133a and a first drain electrode 136a. The first gate electrode 105a is connected to the gate line 145 through a first gate contact hole 142a. The first source electrode 133a extends from the data line 130. The first drain electrode 136a is spaced apart from the first source electrode 133a.

The driving TFT DTr includes a second gate electrode 105b, a second active layer (not shown), third and fourth ohmic contact layers (not shown), a second source electrode (133b) and a second drain electrode 136b. The driving TFT DTr is electrically connected to the switching TFT STr by a gate auxiliary pattern 146 and a gate connection electrode 172. The gate auxiliary pattern 146 is connected to the second gate electrode 105b through a second gate contact hole 142b. The gate connection electrode 172 is connected to the first drain electrode 136a through a first drain contact hole 152a and the gate auxiliary pattern 146 through an auxiliary pattern contact hole 153. Namely, one end of the gate connection electrode 172 contacts the first drain electrode 136a through a first drain contact hole 152a, and the other end of the gate connection electrode 172 contacts the gate auxiliary pattern 146 through an auxiliary pattern contact hole 153. As a result, the first drain electrode 136a is electrically connected to the second gate electrode 105b through the gate connection electrode 172 and the gate auxiliary pattern 146 such that the driving TFT DTr is electrically connected to the switching TFT STr.

A pixel electrode 170, which is connected to the second drain electrode 136b through a second drain contact hole 152b, is disposed in the pixel region P. The first power line 134 extends to form the second source electrode 133b of the driving TFT DTr. The second source electrode 133b is spaced apart from the second drain electrode 136b. The second gate electrode 105b extends to overlap the first power line 134. The overlapped portion of the second gate electrode 105b serves as a first storage electrode 106, the overlapped portion of the first power line 134 serves as a second storage electrode 137, and a gate insulating layer (not shown) and an interlayer insulating layer (not shown) between the first and second storage electrodes 106 and 137 serve as a dielectric material layer. The first storage electrode 106, the second storage electrode 137 and the gate insulating layer and the interlayer insulating layer constitute a storage capacitor StgC.

A bank (not shown) is disposed at boundary of the pixel region P. The bank overlaps edges of the pixel electrode 170. The bank is formed of an inorganic insulating material or an organic insulating material. On the pixel electrode 170, an organic luminescent layer (not shown) is disposed in a region surrounded by the bank. The organic luminescent layer emits one of red color light, green color light and blue color light. A reference electrode (not shown) is disposed over an entire surface of the substrate 101. Namely, the reference electrode covers the bank and the organic luminescent layer. The pixel electrode 170, the organic luminescent layer and the reference electrode constitute an organic electroluminescent diode (not shown). The pixel electrode 170, as a first electrode of the organic electroluminescent diode, is formed of a transparent conductive material having a relatively high work function to serves as an anode. The reference electrode, as a second electrode of the organic electroluminescent diode, is formed of an opaque metallic material having a relatively low work function to serves as a cathode. The reference electrode also serves as a reflection plate.

An organic luminescent layer (not shown) in one pixel region P is separated from the organic luminescent layer in another pixel region P by the bank. In addition, an electrical short between the pixel electrode 170 and a reference electrode (not shown), which is disposed over an entire surface of the substrate 101, is prevented by the bank.

FIGS. 5A to 5D are cross-sectional views showing pixel regions, each of which emits different colors, respectively, taken along the line V-V of FIG. 4. For convenience of explanation, a switching region SA, where the switching TFT is disposed, a driving region DA, where the driving TFT is disposed, and a storage region StgA, where the storage capacitor StgC is disposed, are defined in the pixel region P.

Referring to FIGS. 5A to 5D, a buffer layer 102 of an inorganic insulating material is disposed on the substrate 101. The first gate electrode 105a is disposed on the buffer layer 102 and in the switching region SA, and the second gate electrode 105b is disposed on the buffer layer 102 and in the driving region DA. The second gate electrode 105b extends into the storage region StgA to form the first storage electrode 106. For example, each of the first gate electrode 105a and the second gate electrode 105b is formed of impurity-doped polycrystalline silicon.

A first gate insulating layer 109a is disposed on the first gate electrode 105a, and a second gate insulating layer 109b is disposed on second gate electrode 105b. Each of the first and second gate insulating layers 109a and 109b is formed of an inorganic insulating material. For example, each of the first and second gate insulating layers 109a and 109b is formed of silicon oxide or silicon nitride. The second gate insulating layer 105b is also disposed on the first storage electrode 106. The first gate insulating layer 109a has the same plane shape and plane area as the first gate electrode 105a such that the first gate insulating layer 109a perfectively overlaps the first gate electrode 105a. The second gate insulating layer 109b has the same plane shape and plane area as the second gate electrode 105b such that the second gate insulating layer 109b perfectively overlaps the second gate electrode 105b.

The first active layer 115a is disposed on the first gate insulating layer 109a and corresponds to the first gate electrode 105a. The second active layer 115b is disposed on the second gate insulating layer 109b and corresponds to the second gate electrode 105b. Namely, the first active layer 115a and the second active layer 115b are disposed in the switching region SA and the driving region DA, respectively. Each of the first and second active layers 115a and 115b is formed of intrinsic polycrystalline silicon.

An interlayer insulating layer 122 including first to fourth active contact holes 123a, 123b, 123c and 123d is disposed over an entire surface of the substrate 101 and on the first and second active layers 115a and 115b. The first and second active contact holes 123a and 123b respectively expose both sides of the first active layer 115a, and the third and fourth active contact holes 123c and 123d respectively expose both sides of the second active layer 115b. A portion of the interlayer insulating layer 122 corresponding to a center of each of the first and second active layers 115a and 115b serves as an etch-stopper. The interlayer insulating layer 122 is formed of an inorganic insulating material. For example, the inorganic insulating material includes silicon oxide or silicon nitride.

The first and second ohmic contact layers 127a and 127b, which are spaced apart from each other, are disposed on the interlayer insulating layer 122 and in the switching region SA. The first and second ohmic contact layers 127a and 127b contact the first active layer 115a through the first and second active contact holes 123a and 123b, respectively. The third and fourth ohmic contact layers 127c and 127d, which are spaced apart from each other, are disposed on the interlayer insulating layer 122 and in the driving region DA. The third and fourth ohmic contact layers 127c and 127d contact the second active layer 115b through the third and fourth active contact holes 123c and 123d, respectively. The first and second ohmic contact layers 127a and 127b and the third and fourth ohmic contact layers 127c and 127d are formed of impurity-doped amorphous silicon.

The first source electrode 133a is disposed on the first ohmic contact layer 127a, and the first drain electrode 136a is disposed on the second ohmic contact layer 127b. The first drain electrode 136a is spaced apart from the first source electrode 133a. The second source electrode 133b is disposed on the third ohmic contact layer 127c, and the second drain electrode 136b is disposed on the fourth ohmic contact layer 127d. The second drain electrode 136b is spaced apart from the second source electrode 133b. The second source electrode 133a extends into a storage region StgA to form the second storage electrode 137. The second source electrode 133a further extends to form the first power line 134 (of FIG. 4).

The first gate electrode 105a of impurity-doped polycrystalline silicon, the first gate insulating layer 109a, the first active layer 115a of intrinsic polycrystalline silicon, the interlayer insulating layer 122, the first and second ohmic contact layers 127a and 127b, the first source electrode 133a and the first drain electrode 136a constitute the switching TFT STr in the switching region SA. The second gate electrode 105b of impurity-doped polycrystalline silicon, the second gate insulating layer 109b, the second active layer 115b of intrinsic polycrystalline silicon, the interlayer insulating layer 122, the third and fourth ohmic contact layers 127c and 127d, the second source electrode 133b and the second drain electrode 136b constitute the driving TFT DTr in the driving region DA.

The data line 130 (of FIG. 4), which is connected to the first source electrode 133a, is disposed over the interlayer insulating layer 122. Each of the first source electrode 133a, the first drain electrode 136a, the second source electrode 133b, the second drain electrode 136b and the data line 130 has a double-layered structure or a triple-layered structure.

A first passivation layer 140 is disposed on the first source electrode 133a, the first drain electrode 136a, the second source electrode 133b, the second drain electrode 136b and the data line 130. The first passivation layer 140 is formed of an inorganic insulating material. For example, the first passivation layer 140 is formed of silicon oxide or silicon nitride. The first passivation layer 140, and the interlayer insulating layer 122 and the first and second gate insulating layers 109a and 109b under the first passivation layer 140 are patterned to form the first and second gate contact holes 142a and 142b respectively exposing the first and second gate electrodes 105a and 105b. The first passivation layer 140 also includes the power contact hole 154 (of FIG. 4) exposing the first power line 134 (of FIG. 4).

The gate line 145 is disposed on the first passivation layer 140. The gate line 145 is connected to the first gate electrode 105a through the first gate contact hole 142a and crosses the data line 130 (of FIG. 4) to define the pixel region P. The gate auxiliary pattern 146, which contacts the second gate electrode 105b through the second gate contact hole 142b, is disposed on the first passivation layer 140. The second power line 148 (of FIG. 4), which is parallel to and spaced apart from the gate line 145, is disposed on the first passivation layer 140 and is connected to the first power line 134 (of FIG. 4) through the power contact hole 154 (of FIG. 4).

A second passivation layer 150 of an inorganic insulating material is disposed on the gate line 145, the gate auxiliary pattern 146 and the second power line 148 (of FIG. 4). For example, the second passivation layer 150 is formed of silicon oxide or silicon nitride. The second passivation layer 150 includes an auxiliary pattern contact hole 153 exposing the gate auxiliary pattern 146. The second passivation layer 150 and the first passivation layer 140 under the second passivation layer 150 are patterned to form the first and second drain contact holes 152a and 152b respectively exposing the first and second drain electrodes 136a and 136b.

The pixel electrode 170 is disposed on the second passivation layer 150 and contacts the second drain electrode 136b through the second drain contact hole 152b. The gate connection electrode 172 contacting the first drain electrode 136a through the first drain contact hole 152a and the gate auxiliary pattern 146 through the auxiliary pattern contact hole 153 is disposed on the second passivation layer 150. Each of the pixel electrode 170 and the gate connection pattern 172 is formed of a transparent conductive material. For example, each of the pixel electrode 170 and the gate connection pattern 172 is formed indium-tin-oxide (ITO) or indium-zinc-oxide (IZO).

In the present invention, since the first and second active layers 115a and 115b are formed of intrinsic polycrystalline silicon, mobility in the first and second active layers 115a and 115b is increased. In addition, since the first and second gate electrodes 105a and 105b are formed of impurity-doped polycrystalline silicon, not a metallic material, there is no deformation during a crystallizing process for the first and second active layers 115a and 115b.

Furthermore, since the interlayer insulating layer 122 at a center of each of the first and second active layers 115a and 115b serves as an etch-stopper, a thickness of the first and second active layers 115a and 115b is uniformed such that properties of the TFTs are not degraded.

The bank 175 is disposed on the pixel electrode 170, the gate connection electrode 172 and the second passivation layer 150. The bank 175 covers a boundary of the pixel region P such that the bank 175 has a lattice shape having an opening which corresponds to the pixel region P. The bank 175 also covers the switching and driving TFTs STr and DTr. The bank 175 covers edges of the pixel electrode 170 and is formed of an inorganic insulating material or an organic insulating material. The pixel electrode 170 is exposed through the opening of the bank 175.

The organic luminescent layer 177, which emits one of red color light, green color light and blue color light, is disposed on the pixel electrode 170 exposed through the opening. Namely, the organic luminescent layer 177 in each pixel region P is surrounded by the bank 175. The reference electrode 179 is disposed on the bank 175 and the organic luminescent layer 177. Namely, the reference electrode 179 covers an entire of a display region of the substrate 101. The pixel electrode 170, the organic luminescent layer 177 and the reference electrode 179 constitute the organic electroluminescent diode E.

In the present invention, a portion of the pixel electrode 170 contacting the organic luminescent layer 177 has a difference in a height from the substrate 101. Namely, a total thickness of inorganic insulating material layers, which include at least one of the buffer layer 102, the interlayer insulating layer 122, the first passivation layer 140 and the second passivation layer 150, between the portion of the pixel electrode 150 and the substrate 101 is changed such that emitting efficiency is optimized. As a result, emitting efficiency of the organic luminescent layer 177 is maximized by a micro-cavity effect. The micro-cavity effect is to minimize an absorbing quantity of light with a specific wavelength by a material layer by controlling a thickness of the material layer and is a structure formed by reflecting faces on the two sides of a spacer layer. In the present invention, the light from the organic luminescent layer 177 is selectively reflected between the reference electrode 179 of an opaque metallic material and the organic insulating materials by the micro-cavity effect. As a result, since light having a desired wavelength is selectively transmitted, color reproductivity and emitting efficiency can be maximized.

In addition, by controlling a thickness of the organic luminescent layer 177 in the pixel regions P, the emitting efficiency is further improved. Referring to FIGS. 5A to 5C, a thickness of the organic luminescent layer 177 in FIG. 5B is larger than that in FIG. 5A and smaller than that in FIG. 5C.

Referring to FIG. 5A, all of the buffer layer 102, the interlayer insulating layer 122, the first passivation layer 140 and the second passivation layer 150 are disposed between the substrate 101 and the pixel electrode 170. Referring to FIG. 5B, the buffer layer 102, the first passivation layer 140 and the second passivation layer 150 except the interlayer insulating layer 122 are disposed between the substrate 101 and the pixel electrode 170. Namely, a portion of the interlayer insulating layer 122 is removed such that a transmissive hole TH exposing the buffer layer 102 is formed. In the transmissive hole TH, the first passivation layer 150 contacts the buffer layer 102.

Referring to FIG. 5C, the buffer layer 102 and the second passivation layer 150 except the interlayer insulating layer 122 and the first passivation layer 140 are disposed between the substrate 101 and the pixel electrode 170. Namely, a portion of the interlayer insulating layer 122 and the first passivation layer 140 are removed such that a transmissive hole TH exposing the buffer layer 102 is formed. In the transmissive hole TH, the second passivation layer 150 contacts the buffer layer 102. Referring to FIG. 5D, the buffer layer 102 except the interlayer insulating layer 122, the first passivation layer 140 and the second passivation layer 150 is disposed between the substrate 101 and the pixel electrode 170. Namely, a portion of the interlayer insulating layer 122, the first passivation layer 140 and the second passivation layer 150 are removed such that a transmissive hole TH exposing the buffer layer 102 is formed. In the transmissive hole TH, the pixel electrode 170 contacts the buffer layer 102.

In the present invention, considering properties of a material of the organic luminescent layer 177, a laminated structure of the inorganic insulating layers is selected. For example, a first pixel region P for emitting red color light has a structure in one of FIGS. 5A to 5D, a second pixel region for emitting green color light has a structure in another one of FIGS. 5A to 5D, and a third pixel region for emitting blue color light has a structure in the other one of FIGS. 5B to 5D. Alternatively, one pixel region P of the first to third pixel regions P has a structure in one of FIGS. 5A to 5D, and the other two pixel regions P of the first to third pixel regions P have a structure in another one of FIGS. 5A to 5D.

The organic luminescent materials for emitting red color light, green color light and blue color light have different properties. In addition, red color light, green color light and blue color light have different wavelength. Accordingly, when the inorganic insulating layers have the same thickness, there is no micro-cavity effect. However, in the present invention, since a total thickness the inorganic insulating layers is controlled, there is micro-cavity effect such that color reproductivity and emitting efficiency of OELD are improved. In addition, transmissivity is increased by reducing a total thickness of the the inorganic insulating layers.

In FIG. 5B, there are three inorganic insulating layers, i.e., the buffer layer 102, the first passivation layer 140 and the second passivation layer 150, by removing the interlayer insulating layer 122. In FIG. 5C, there are two inorganic insulating layers, i.e., the buffer layer 102 and the second passivation layer 150, by removing the interlayer insulating layer 122 and the first passivation layer 140. However, there is no limitation in the removed inorganic insulating layer. For example, by removing the first passivation layer 140, there are three inorganic insulating layers, i.e., the buffer layer 102, the interlayer insulating layer 122 and the second passivation layer 150. For example, by removing the first passivation layer 140 and the second passivation layer 150, there are two inorganic insulating layers, i.e., the buffer layer 102 and the interlayer insulating layer 122.

A fabricating method will be explained in brief with reference to FIGS. 5A to 5D.

First, the buffer layer 102 is formed on the substrate 101 by depositing an inorganic insulating material. For example, the inorganic insulating material includes silicon oxide or silicon nitride. When a crystallizing process is performed under a temperature of about 600 to about 800° C., an alkali ion can be diffused into polycrystalline silicon without the buffer layer 102 when the substrate 101 is directly exposed to the high temperature in the crystallizing process. The problem can be prevented by the buffer layer 102.

Next, a first impurity-doped amorphous silicon layer (not shown), a first inorganic insulating material layer (not shown) and an intrinsic amorphous silicon layer (not shown) are sequentially formed on the buffer layer 102 by sequentially depositing impurity-doped amorphous silicon, an inorganic insulating material, e.g., silicon nitride or silicon oxide, and intrinsic amorphous silicon.

The intrinsic amorphous silicon layer has a thickness of about 300 to 1000 Å. In the related art array substrate, considering a thickness etched by a dry-etching process for an ohmic contact layer, the intrinsic amorphous silicon layer has a thickness over about 1000 Å. However, since a portion of the interlayer insulating layer 122 serves as an etch-stopper during the dry-etching process, a thickness of the intrinsic amorphous silicon layer is not reduced after the dry-etching process. Accordingly, the intrinsic amorphous silicon layer of the present invention has a smaller thickness than that of the related art.

Next, a crystallizing process is performed to increase mobility in the channel such that the intrinsic amorphous silicon layer is crystallized into an intrinsic polycrystalline silicon layer (not shown). The crystallizing process is a solid phase crystallization process (SPC). For example, the solid phase crystallization process is a thermal crystallization process under a temperature of about 600 to about 800° C. or an alternating magnetic field crystallization process under a temperature of about 600 to 700° C. The impurity-doped amorphous silicon of the first impurity-doped amorphous silicon layer is also crystallized into impurity-doped polycrystalline silicon by the above crystallizing process to form an impurity-doped polycrystalline silicon layer (not shown).

Next, the intrinsic polycrystalline silicon layer, the first inorganic insulating material layer and the impurity-doped polycrystalline silicon layer are patterned by a mask process to form the first gate electrode 105a from the impurity-doped polycrystalline silicon layer, the first gate insulating layer 109a from the first inorganic insulating material layer, the first intrinsic polycrystalline silicon pattern (not shown) from the intrinsic polycrystalline silicon layer, the second gate electrode 105b from the impurity-doped polycrystalline silicon layer, the second gate insulating layer 109b from the first inorganic insulating material layer, and the second intrinsic polycrystalline silicon pattern (not shown) from the intrinsic polycrystalline silicon layer. The first gate electrode 105a, the first gate insulating layer 109a and the first intrinsic polycrystalline silicon pattern are disposed in the switching region SA and have substantially the same shape and the same area in a plane view as one another to perfectly overlap. second gate electrode 105b, the second gate insulating layer 109b and the second intrinsic polycrystalline silicon pattern are disposed in the driving region DA and have substantially the same shape and the same area in a plane view as one another to perfectly overlap. A portion of the second gate electrode 105b is defined as the first storage electrode 106 in the storage region StgA.

In the present invention, the first and second gate electrodes 105a and 105b are formed of impurity-doped polycrystalline silicon to resolve below problem. In a fabricating process of the bottom gate type TFT, the gate line and the gate electrode are formed on the substrate by depositing and patterning a metallic material having a low resistant property, and the semiconductor layer of amorphous silicon is formed over the gate electrode with the gate insulating layer therebetween. To crystallize the semiconductor layer, the SPC process is performed under a relatively high temperature, for example, above 600° C. During the SPC process, the gate electrode and the gate line of the metallic material are deformed. Or, the gate electrode protrudes through the gate insulating layer because of a thermal effect during the SPC process such that the gate electrode contacts the intrinsic polycrystalline silicon layer. It may be referred to as a spike problem. However, since the first and second gate electrodes 105a and 105b are formed of impurity-doped polycrystalline silicon in the present invention, there is no problem.

Next, the first and second intrinsic polycrystalline silicon patterns are patterned to form the first active layer 115a on the first gate insulating layer 109a and in the switching region SA and the second active layer 115b on the second gate insulating layer 109b and in the driving region DA. In this case, a portion of the second intrinsic polycrystalline silicon pattern in the storage region StgA is removed to expose the first storage electrode 106.

Next, the interlayer insulating layer 122 is formed on the first and second active layers 115a and 115b. The interlayer insulating layer 122 includes an inorganic insulating material. For example, the inorganic insulating material includes silicon oxide or silicon nitride. The interlayer insulating layer 122 is patterned to form the first to fourth active contact holes 123a, 123b, 123c and 123d. The first and second active contact holes 123a and 123b respectively expose both sides of the first active layer 115a, and the third and fourth active contact holes 123c and 123d respectively expose both sides of the second active layer 115b. A portion of the interlayer insulating layer 122 corresponding to a center of each of the first and second active layers 115a and 115b serves as an etch-stopper. Other portion of the interlayer insulating layer 122 serves as an insulating layer.

On the other hand, referring to FIGS. 5B to 5D, a portion of the interlayer insulating layer 122 is also removed to form the transmissive hole TH corresponding to the organic luminescent layer 177 when the first to fourth active contact holes 123a to 123d are formed.

Next, a second impurity-doped amorphous silicon layer (not shown) and a first metallic material layer (not shown) are sequentially formed on the interlayer insulating layer 122.

The second impurity-doped amorphous silicon layer is formed of impurity-doped amorphous silicon. The first metallic material layer having a single layer is shown. The first metallic material layer of the single layer is formed of one of molybdenum (Mo), chromium (Cr) and MoTi. Alternatively, the first metallic material layer may has a double-layered structure or a triple-layered structure.

The first metallic material layer and the second impurity-doped amorphous silicon layer are patterned to form the data line 130, the first to fourth ohmic contact layers 127a, 127b, 127c and 127d, the first source electrode 133a, the first drain electrode 136a, the second source electrode 133b, the second drain electrode 136b and the first power line 134. A dummy pattern (not shown) from the impurity-doped amorphous silicon layer is disposed under each of the data line 130 and the first power line 134.

The data line 130 extends along a direction. The first and second ohmic contact layers 127a and 127b are disposed in the switching region SA and contact the first active layer 115a through the first and second active contact holes 123a and 123b, respectively. The third and fourth ohmic contact layers 127c and 127d are disposed in the driving region SA and contact the second active layer 115b through the third and fourth active contact holes 123c and 123d, respectively.

The first source electrode 133a, which is connected to the data line 130, is disposed on the first ohmic contact layer 127a, and the first drain electrode 136a is disposed on the second ohmic contact layer 127b. The second drain electrode 136a is spaced apart from the second source electrode 133a. The second source electrode 133b is disposed on the third ohmic contact layer 127c, and the second drain electrode 136b is disposed on the fourth driving ohmic contact layer 127d. The second drain electrode 136b is spaced apart from the second source electrode 133b.

The first power line 134 is parallel to and spaced apart from the data line 130. A portion of the first power line 134 overlaps the first storage electrode 106 to define the second storage electrode 137. The first storage electrode 106, the second storage electrode 137 and the second gate insulating layer 109b and the interlayer insulating layer 122 constitute a storage capacitor StgC.

Although not shown, first to fourth barrier patterns of intrinsic amorphous silicon may be disposed under each of the first to fourth ohmic contact layers 127a, 127b, 127c and 127d, respectively. Namely, the first to fourth barrier patterns contact the first and second active layers 115a and 115b through the first to fourth active contact holes 123a, 123b, 123c and 123d, respectively. The first to fourth barrier patterns have substantially the same plane area and plane shape as the first to fourth ohmic contact layers 127a, 127b 127c and 127d, respectively. An intrinsic amorphous silicon layer for the first to fourth barrier patterns is formed on the interlayer insulating layer 122 before the impurity-doped amorphous silicon for first to fourth ohmic contact layers 127a, 127b 127c and 127d is formed. Then, the intrinsic amorphous silicon layer is patterned with the impurity-doped amorphous silicon layer and the first metallic material layer.

Intrinsic polycrystalline silicon has a stronger adhesive property with intrinsic amorphous silicon than impurity-doped amorphous silicon. Accordingly, by disposing the first to fourth barrier patterns of intrinsic amorphous silicon between the first active layer 115a and each of the first and second ohmic contact layers 127a and 127b and between the second active layer 115b and each of the third and fourth ohmic contact layers 127c and 127d, respectively, an adhesive property can be improved.

On the other hand, before forming the impurity-doped amorphous silicon layer or the intrinsic amorphous silicon layer for the first to fourth barrier patterns on the interlayer insulating layer 122, a cleaning process using a buffered oxide etchant (BOE) may be performed. It may be called as a BOE cleaning process. The intrinsic amorphous silicon layer for the first and second active layers 115a and 115b is directly exposed to the crystallizing process under a high temperature of 600. As a result, a thermal oxidation layer (not shown) is formed on a top surface of the first and second active layers 115a and 115b. For example, an ohmic contact property between the first active layer 115a and each of the first and second ohmic contact layers 127a and 127b and between the second active layer 115b and each of the third and fourth ohmic contact layers 127c and 127d is degraded by the thermal oxidation layer. Accordingly, the BOE cleaning process can be performed onto the first and second active layers 115a and 115b to remove the thermal oxidation layer before the step of forming the impurity-doped amorphous silicon layer for the ohmic contact layers 127a, 127b, 127c and 127d or the intrinsic amorphous silicon layer for the first to fourth barrier patterns.

In the present invention, since a portion of the interlayer insulating layer 122 as the etch-stopper covers the center portion of each of the first and second active layers 115a and 115b, there is no damage on the first and second active layers 115a and 115b during a dry-etching process for the ohmic contact layers 127a, 127b, 127c and 127d. Namely, since the interlayer insulating layer 122 covers the center portion of each of the first and second active layers 115a and 115b during the dry-etching process for the ohmic contact layers 127a, 127b, 127c and 127d, the interlayer insulating layer 122 protects the first and second active layers 115a and 115b such that a thickness of each of the first and second active layers 115a and 115b is not reduced by the dry-etching process. Accordingly, each of first and second active layers 115a and 115b has an uniform thickness.

The first gate electrode 105a of impurity-doped polycrystalline silicon, the first gate insulating layer 109a, the first active layer 115a of intrinsic polycrystalline silicon, the interlayer insulating layer 122, the first and second ohmic contact layers 127a and 127b of impurity-doped amorphous silicon, the first source electrode 133a and the first drain electrode 136a constitute the switching TFT STr in the switching region SA. The second gate electrode 105b of impurity-doped polycrystalline silicon, the second gate insulating layer 109b, the second active layer 115b of intrinsic polycrystalline silicon, the interlayer insulating layer 122, the third and fourth ohmic contact layers 127c and 127d of impurity-doped amorphous silicon, the second source electrode 133b and the second drain electrode 136b constitute the driving TFT DTr in the driving region DA. The first storage electrode 106, the second storage electrode 137 and the gate insulating layer and the interlayer insulating layer constitute a storage capacitor StgC in the storage region StgA.

Next, the first passivation layer 140 is formed on the first and second source electrodes 133a and 133b, the first and second drain electrodes 136a and 136b, the second storage electrode 137, the first power line 134 and the data line 130 by depositing an inorganic insulating material. For example, the inorganic insulating material includes silicon oxide or silicon nitride.

The first passivation layer 140, and the interlayer insulating layer 122 and the first gate insulating layer 109a under the first passivation layer 140 are patterned by a mask process to form the first gate contact hole 142a exposing a portion of the first gate electrode 105a. In addition, the first passivation layer 140, and the interlayer insulating layer 122 and the second gate insulating layer 109b under the first passivation layer 140 are patterned to form the second gate contact hole 142b exposing a portion of the second gate electrode 105b. In addition, a power contact hole 154 exposing the first power line 134 is formed through the first passivation layer 140.

On the other hand, referring to FIGS. 5C and 5D, a portion of the first passivation layer 140 is also removed to form the transmissive hole TH corresponding to the organic luminescent layer 177 and exposing the buffer layer 102 when the first and second gate contact holes 142a and 142b and the power contact hole 154 are formed.

Next, a second metallic material layer (not shown) is formed on the first passivation layer 140 including the first and second gate contact holes 142a and 142b, and the power contact hole 154 by depositing a second metallic material, for example, aluminum (Al), Al alloy such as AlNd, copper (Cu), Cu alloy, molybdenum (Mo) or chromium (Cr). The second metallic material layer having a single layer is shown. Alternatively, the second metallic material layer may have a double-layered structure or a triple-layered structure. The second metallic material layer is patterned to form the gate line 145, the gate auxiliary pattern 146 and the second power line 147 (of FIG. 4).

The gate line 145 contacts the first gate electrode 105 and crosses the data line 130. The gate auxiliary pattern 146 contacts the second gate electrode 105b through the second gate contact hole 142b. The second power line 147 (of FIG. 4) contacts the first power line 134 through the power contact hole 154. The second power line 147 is parallel to and spaced apart from the gate line 145.

Next, the second passivation layer 150 is formed on the gate line 145, the gate auxiliary pattern 146 and the second power line 147. The second passivation layer 150 is formed of an inorganic insulating material. For example, the inorganic insulating material includes silicon oxide or silicon nitride. The second passivation layer 150 and the first passivation layer 140 are patterned to form the first and second drain contact holes 152a and 152b exposing the first drain electrode 136a and the second drain electrode 136b, respectively. At the same time, the auxiliary pattern contact hole 153 is formed through the second passivation layer 150 to expose the gate auxiliary pattern 146.

On the other hand, referring to FIG. 5D, a portion of the second passivation layer 140 is also removed to form the transmissive hole TH corresponding to the organic luminescent layer 177 and exposing the buffer layer 102 when the first and second drain contact holes 152a and 152b and the auxiliary pattern contact hole 153 are formed.

Next, a transparent conductive material layer (not shown) is formed on the second passivation layer 150 by depositing a transparent conductive material such as ITO and IZO. The transparent conductive material layer is patterned to form the pixel electrode 170 and the connection electrode 172 for connecting the first drain electrode 136a and the gate auxiliary pattern 146. The pixel electrode 170 is connected to the second drain electrode 136b through the second drain contact hole 152b. In FIGS. 5A to 5C, the pixel electrode 170 contacts the second passivation layer 150. In FIG. 5D, the pixel electrode 170 contacts the buffer layer 102. One end of the gate connection electrode 172 contacts the first drain electrode 136a through the first drain contact hole 152a, and the other end of the gate connection electrode 172 contacts the gate auxiliary pattern 146 through the auxiliary pattern contact hole 153. As a result, the driving TFT DTr is electrically connected to the switching TFT STr.

Next, the bank 175 of an inorganic insulating material or an organic insulating material is formed at a boundary of the pixel region and on the pixel electrode 170, the gate connection electrode 172 and the second passivation layer 150. The bank 175 has a lattice shape to form a space for the organic luminescent layer 177. The organic luminescent layer 177 is formed on the pixel electrode 170 and in the space of the bank 175. The organic luminescent layer 177 in one pixel region P may have a difference in a thickness than that in another pixel region P. For example, the organic luminescent layer 177 in one pixel region P emits red color light, that in another one pixel region P emits green color light, and that in the other one pixel region P emits blue color light. The reference electrode 179 of an opaque metallic material is formed on the bank 175 and the organic luminescent layer 177 such that an array substrate for an OELD device is obtained.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An array substrate for an organic electroluminescent device, comprising:
    a substrate including a pixel region;
    first and second gate electrodes on the substrate;
    first and second gate insulating layers on the first and second gate electrodes, respectively;
    first and second active layers on the first and second gate insulating layers, respectively;
    an interlayer insulating layer on the first and second active layers and including first to fourth active contact holes, the first and second active contact holes respectively exposing both sides of the first active layer, the third and fourth active contact holes respectively exposing both sides of the second active layer;
    first and second ohmic contact layers respectively contacting the both sides of the first active layer through the first and second active contact holes;
    third and fourth ohmic contact layers respectively contacting the both sides of the second active layer through the third and fourth active contact holes;
    first and second source electrodes on the first and third ohmic contact layers, respectively;
    first and second drain electrodes on the second and fourth ohmic contact layers, respectively, the first drain electrode electrically connected to the second gate electrode;
    a data line on the interlayer insulating layer and connected to the first source electrode;
    a first power line parallel to the data line and connected to the second source electrode;
    a first passivation layer on the first and second source electrodes, the first and second drain electrodes and the data line and including a first gate contact hole exposing the first gate electrode;
    a gate line on the first passivation layer and contacting the first gate electrode through the first gate contact hole, the gate line crossing the data line to define the pixel region;
    a second passivation layer on the gate line, the second passivation layer and the first passivation layer including a first drain contact hole exposing the second drain electrode;
    a pixel electrode in the pixel region and on the second passivation layer, the pixel electrode contacting the second drain electrode through the first drain contact hole;
    an organic luminescent layer on the pixel electrode and in the pixel region; and
    a reference electrode on the organic luminescent layer and covering an entirety of the substrate,
    wherein portions of the pixel electrode respectively contacting the organic luminescent layer in one pixel region and in another one pixel region have different heights from the substrate.

2. The array substrate according to claim 1, wherein the interlayer insulating layer, the first passivation layer and the second passivation layer are disposed between the substrate and the portion of the pixel electrode in the one pixel region, and at most two of the interlayer insulating layer, the first passivation layer and the second passivation layer are disposed between the substrate and the portion of the pixel electrode in the another one pixel region.

3. The array substrate according to claim 1, wherein two of the interlayer insulating layer, the first passivation layer and the second passivation layer are disposed between the substrate and the portion of the pixel electrode in the one pixel region, and at most one of the interlayer insulating layer, the first passivation layer and the second passivation layer are disposed between the substrate and the portion of the pixel electrode in the another one pixel region.

4. The array substrate according to claim 1, further comprising a buffer layer on the substrate and under the first and second gate electrodes.

5. The array substrate according to claim 4, wherein the buffer layer, the interlayer insulating layer, the first passivation layer and the second passivation layer are disposed between the substrate and the portion of the pixel electrode in the one pixel region, and at most three of the buffer layer, the interlayer insulating layer, the first passivation layer and the second passivation layer are disposed between the substrate and the portion of the pixel electrode in the another one pixel region.

6. The array substrate according to claim 4, wherein three of the buffer layer, the interlayer insulating layer, the first passivation layer and the second passivation layer are disposed between the substrate and the portion of the pixel electrode in the one pixel region, and at most two of the buffer layer, the interlayer insulating layer, the first passivation layer and the second passivation layer are disposed between the substrate and the portion of the pixel electrode in the another one pixel region.

7. The array substrate according to claim 4, wherein two of the buffer layer, the interlayer insulating layer, the first passivation layer and the second passivation layer are disposed between the substrate and the portion of the pixel electrode in the one pixel region, and at most one of the buffer layer, the interlayer insulating layer, the first passivation layer and the second passivation layer is disposed between the substrate and the portion of the pixel electrode in the another one pixel region.

8. The array substrate according to claim 1, wherein each of the interlayer insulating layer, the first passivation layer and the second passivation layer is formed of an inorganic insulating material.

9. The array substrate according to claim 1, wherein the organic luminescent layer in the one pixel region and in the another one pixel region have different thickness.

10. The array substrate according to claim 9, wherein the organic luminescent layer in the one pixel region is formed of an organic emitting material for emitting one of red color light, green color light and blue color light, and the organic luminescent layer in the another one pixel region is formed of an organic emitting material for emitting another one of red color light, green color light and blue color light.

11. The array substrate according to claim 9, wherein the organic luminescent layer in the other one pixel region has a different thickness than each of the organic luminescent layer in the one pixel region and the organic luminescent layer in the another one pixel region.

12. The array substrate according to claim 11, wherein the organic luminescent layer in the one pixel region is formed of an organic emitting material for emitting red color light, the organic luminescent layer in the another one pixel region is formed of an organic emitting material for emitting green color light, and the organic luminescent layer in the other one pixel region is formed of an organic emitting material for emitting blue color light.

13. The array substrate according to claim 1, wherein each of the first and second gate electrodes is formed of impurity-doped polycrystalline silicon.

14. The array substrate according to claim 1, wherein each of the first and second active layers is formed of intrinsic amorphous silicon.

15. The array substrate according to claim 1, further comprising a second power line parallel to the gate line and on the first passivation layer, wherein the first passivation layer includes a power contact hole exposing the first power line, and the second power line is connected to the first power line through the power contact hole.

16. The array substrate according to claim 1, further comprising a gate auxiliary pattern on the first passivation layer and a gate connection electrode on the second passivation layer, wherein the first passivation layer, the interlayer insulating layer and the second gate insulating layer include a second gate contact hole exposing the second gate electrode, and the gate auxiliary pattern contacts the second gate electrode through the second gate contact hole, and wherein the second passivation layer includes a gate auxiliary pattern contact hole exposing the gate auxiliary pattern, and the second passivation layer and the first passivation layer include a second drain contact hole exposing the first drain electrode, and wherein the gate connection electrode contacts the gate auxiliary pattern and the first drain electrode through the gate auxiliary pattern contact hole and the second drain contact hole, respectively.

17. The array substrate according to claim 1, wherein the substrate further includes a storage region, and the second gate electrode extends into the storage region to form a first storage electrode such that a portion of the first power line overlaps the first storage electrode.

18. The substrate according to claim 1, further comprising first to fourth barrier patterns between each of the first and second ohmic contact layers and the first active layer and between each of the third and fourth ohmic contact layers and the second active layer, respectively, wherein each of the first to fourth barrier pattern is formed of intrinsic amorphous silicon, and each of the first to fourth ohmic contact layers is formed of impurity-doped amorphous silicon.

19. The array substrate according to claim 1, further comprising a bank at a boundary of the pixel region P and surrounds the organic luminescent layer in the pixel region.

20. The array substrate according to claim 1, wherein the pixel electrode is formed of a transparent conductive material, and the reference electrode is formed of an opaque metallic material.

* * * * *